(12) United States Patent
Hirasawa

(10) Patent No.: US 6,798,189 B2
(45) Date of Patent: Sep. 28, 2004

(54) CURRENT DETECTION RESISTOR, MOUNTING STRUCTURE THEREOF AND METHOD OF MEASURING EFFECTIVE INDUCTANCE

(75) Inventor: Koichi Hirasawa, Nagano (JP)

(73) Assignee: Koa Corporation, Ina (JP)

(*) Notice: Subject to any disclaimer, the term of this patent is extended or adjusted under 35 U.S.C. 154(b) by 20 days.

(21) Appl. No.: 10/170,200

(22) Filed: Jun. 13, 2002

(65) Prior Publication Data

US 2003/0020592 A1 Jan. 30, 2003

(30) Foreign Application Priority Data

| Jun. 14, 2001 | (JP) | ........................................ 2001-180456 |
| Jun. 14, 2001 | (JP) | ........................................ 2001-180457 |
| Oct. 15, 2001 | (JP) | ........................................ 2001-317074 |
| Oct. 15, 2001 | (JP) | ........................................ 2001-317075 |
| Oct. 15, 2001 | (JP) | ........................................ 2001-317076 |

(51) Int. Cl.$^7$ ............................. G01R 1/20; H01C 7/00
(52) U.S. Cl. ......................................... 324/126; 338/49
(58) Field of Search ............................. 324/126, 127, 324/95, 105; 338/49

(56) References Cited

U.S. PATENT DOCUMENTS

| 696,757 A | * | 4/1902 | Rypinski ...................... 338/49 |
| 720,335 A | * | 2/1903 | Eastman ...................... 324/105 |
| 846,969 A | * | 3/1907 | Wohl ........................... 338/49 |
| 2,634,307 A | * | 4/1953 | Kerns Quentin A .......... 324/95 |
| 2,640,092 A | * | 5/1953 | Gilbert et al. ................ 338/49 |
| 4,322,710 A | | 3/1982 | Carson et al. |
| 4,494,068 A | * | 1/1985 | Ley et al. .................... 324/126 |
| 5,068,636 A | * | 11/1991 | Cavigelli ..................... 338/49 |
| 5,336,990 A | * | 8/1994 | Maue .......................... 324/126 |

FOREIGN PATENT DOCUMENTS

| JP | 61-17122 | 5/1986 |
| JP | 7-201537 | 8/1995 |

* cited by examiner

Primary Examiner—Ernest Karlsen
(74) Attorney, Agent, or Firm—Westerman, Hattori, Daniels & Adrian, LLP

(57) ABSTRACT

A mounting structure for current detection resistor device has a feature that voltage detection terminal wiring is configured so as to extend along a current path in the resistor body first, and then, to bend at right angles to the current path, while maintaining electrical isolation from a resistor body of the current detection resistor device. The voltage detection terminal wiring connecting to the voltage detection terminals on the circuit board is disposed to extend for some distance in the same direction as the current path so as to cause mutual-inductance between that section of the voltage detection terminal wiring and the resistor body. This causes cancellation of induced voltage caused by the self-inductance of the resistor body, so that it is possible to nullify detection error generated by the voltage induced by the resistor body from the viewpoint of the measuring system. Therefore, it is possible to detect a large current with good accuracy that may flow in a device such as a current detection resistor device for a switching power source operating at high frequencies. A method is provided for measuring a value of effective inductance that includes the steps of: supplying a flow of current to be measured having a saw-teeth waveform through a resistor device to simulate the actual use; detecting a flow of current and detecting a voltage produced by the flow of the current; and computing an effective inductance value from a variation in the flow of saw-teeth waveform current and a corresponding variation in the voltage.

24 Claims, 12 Drawing Sheets

To voltage detection device

To voltage detection device

Magnetic coupling pattern according to the present invention

*1: Current to be measured I flowing through the resistor body

* 1: Heat generation center

CURRENT DETECTION RESISTOR, MOUNTING STRUCTURE THEREOF AND METHOD OF MEASURING EFFECTIVE INDUCTANCE

BACKGROUND OF THE INVENTION

1. Field of the Invention

The present invention relates to a structure for mounting a current detection resistor device suitable for use in current detection circuit and the like in a switching power circuit, and relates in particular to a technique of mounting a low resistance resistor device on a circuit board for detecting a large current containing high frequency components that may cause problems of parasitic inductance.

2. Description of the Related Art

In recent years, with the trend towards the use of CPU chips operating at low voltage and large current in electronic devices such as personal computers, switching power source including DC/DC converter and the like has been used for supplying a power to the circuits. In such a switching power circuit, a current detection resistor device is being used in frequency bands ranging from several tens to several hundreds kilo Herz (kHz). A saw-teeth waveform current flows ranging from several amperes to several tens of amperes to detect the magnitude of current on the basis of a voltage generated at the both ends of the low resistance resistor device. In such a current detection resistor device, it is necessary that the resistance be as low as practical, typically less than several mili-ohms and also it is desirable that the parasitic inductance of the resistor device itself be as low as possible. This is because the resistance value of the resistor device itself is low and the frequency is relatively high, so that even for a small inductance at the level of 1 nH, the combined impedance generated at the both ends of the resistor device becomes high to produce voltage detection error.

SUMMARY OF THE INVENTION

The present invention is provided in view of the background information described above, an object of the present invention is to provide a structure for mounting a current detection resistor device that can detect, with high precision, a large electrical current that flows in the resistor device in a current detection circuit for a switching power source circuit operating at high frequencies.

Another object of the present invention is to provide a method for measuring an effective inductance value in real-time while the current detection resistor device is in use.

The feature of the mounting structure is that voltage detection terminal wiring is configured so as to extend along current path of the resistor body first, and then, to bend at right angles to the current path, while maintaining electrical isolation from a resistor body of the resistor device.

According to the present invention described above, the wiring pattern is arranged on the circuit board to extend for some distance in the same direction as the current to be measured, thereby causing mutual-inductance between that section of the wiring pattern and the resistor body. This causes cancellation of induced voltage caused by the self-inductance of the resistor body, so that, from the viewpoint of the measuring system, it is possible to nullify detection error generated by the voltage induced by the self-inductance of the resistor body. Therefore, precision determination of current flow is enabled in such cases as a flow of current to be measured in a switching power circuit that contains high frequency components.

Also, the present method of measuring an effective inductance value comprises: connecting to a pair of lands for respective electrodes provided at both ends of a resistor device so as to flow saw-teeth waveform current to be measured through the resistor device; disposing a voltage detection terminal wiring from the lands for detecting a voltage produced between both ends of the resistor device; detecting a flow of current to be measured and detecting a voltage produced by the flow of the current in the resistor device by the voltage detection terminal wiring; and computing the effective inductance value basing on a variation in the flow of current and a corresponding variation in the voltage. Here, it is preferable for the voltage detection terminal wiring to extend inwardly along the central axes of both lands first, and to bend at right angles in opposite directions, along the central axis between the lands, so that one wiring pattern loops to the back side of the substrate through the via-hole on the circuit board to extend towards the direction of other wiring pattern, so that the one wiring pattern and other wiring pattern are aligned and extended in parallel on the front and back surfaces of the circuit board, respectively.

According to the present invention described above, it enables to measure an effective inductance value of the resistor device in-real time in a condition by simulating the actual use of the resistor device. Therefore, it becomes possible to accurately evaluate an effective inductance that greatly affects the measurement errors in resistor devices of lower than several mΩ, thereby enabling to predict error voltage generation when the resistor device is used in a switching power source such as a DC/DC converter. Also, because the effective inductance can be measured for low resistance resistor devices in actual conditions of usage, and therefore, it can contribute to manufacturing a low-inductance current detection resistor device that produces virtually no error voltages.

Also, a feature of the current detection resistor device of the present invention is that the lead wires are connected to the electrodes respectively and extended along the current path in the resistor body on a surface of the resistor body, while maintaining electrical isolation from the resistor body; and voltage detection terminals are positioned at the ends of the lead wires.

According to the present invention described above, by extending the lead wires in the same direction as the direction of flow of the current to be measured and providing sufficient length to the lead wires, mutually induced voltage is generated on the lead wires by the current flowing in the resistor body. Accordingly, it enables to nullify induced voltage caused by self-inductance of the resistor body, thereby effectively reducing the error generated by induced voltage by self-inductance of the resistor body, thus accurate voltage (V=R×I) is detected at the voltage detection terminals. Therefore, precision determination of current flow is enabled in such cases as a flow of current to be measured in a switching power circuit that contains many high frequency components.

The above and other objects, features, and advantages of the present invention will be apparent from the following description when taken in conjunction with the accompanying drawings which illustrates preferred embodiments of the present invention by way of example.

DETAILED DESCRIPTION OF THE PREFERRED EMBODIMENTS

In the following, preferred embodiments will be explained with reference to the drawings.

Figure 1A:
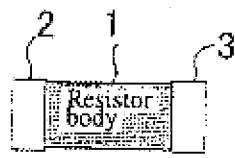
FIGS. 1A and 1C are bottom views of a current detection resistor device, respectively.
Figure 1C:
Figure 1B:
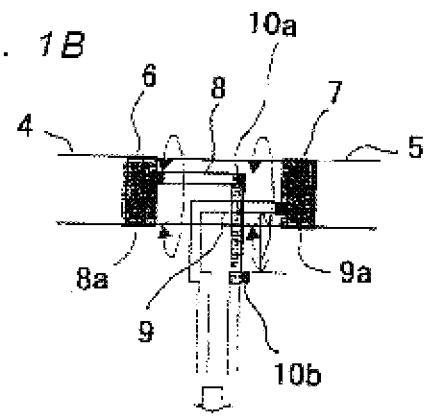
FIGS. 1B and 1D are land patterns for mounting the resistor device.
Figure 1D:
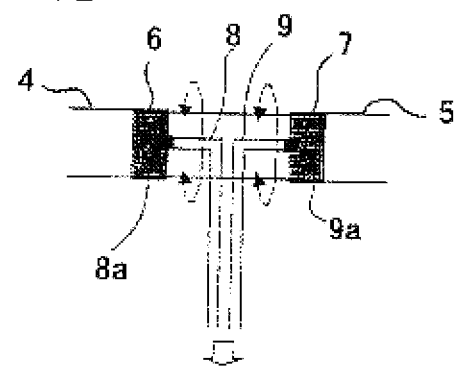
Figure 1E:
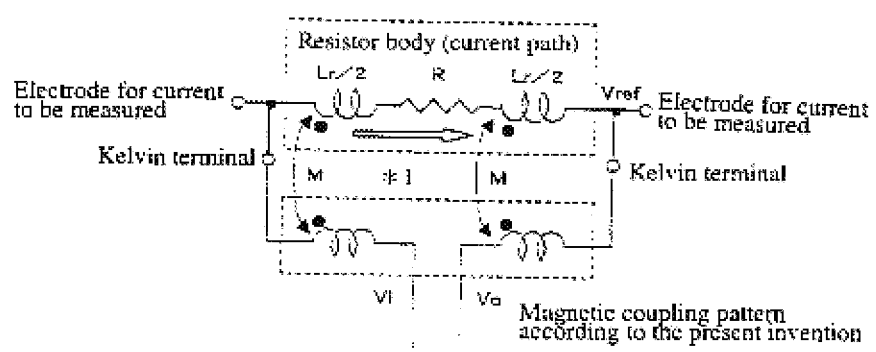
FIG. 1E is a diagram of an equivalent circuit thereof.

FIGS. 1A, 1B and FIGS. 1C, 1D show, respectively, bottom views of the current detection resistor device and land patterns on a circuit board in a first embodiment of the present invention, and FIG. 1E shows its equivalent circuit. The current detection resistor device is provided with electrodes 2, 3 at the longitudinal ends of a resistor body 1 comprised by a copper-nickel alloy, for example. The circuit board for mounting the resistor body 1 is provided with a pair of lands 6, 7 connected to the wiring leads 4, 5 for supplying current to be measured to the resistor body 1, and the electrodes 2, 3 of the resistor device are connected and fixed to the lands 6, 7 on the circuit board. Electrical current to be measured flows between electrodes 2, 3, and a potential difference generated in the resistor body 1 is detected between the voltage detection terminal wirings 8, 9 connected to the lands 6, 7 on the circuit board. In this mounting configuration, the voltage detection terminal wirings 8, 9, respectively connected to the voltage detection terminals 8*a*, 9*a*, extend first along the current path of the current to be measured and then turn at right angles to the current path. The voltage detection terminal wirings 8, 9 are insulated electrically from the resistor body 1. The wiring patterns are connected to a voltage detector (not shown) that may include a differential amplifier and others.

The voltage detection terminal wirings 8, 9 may be placed so as to be displaced with respect to the central axis of the land patterns, as shown in FIGS. 1A and 1B, and may also be placed to the resistor body 1 so as to coincide with the central axis of the land patterns, as shown in FIGS. 1C and 1D. In either case, magnetic coupling shown by the arrow in the diagram can be achieved by disposing the voltage detection terminal wirings 8, 9 near the resistor body 1 in a direction parallel to the current flow in the resistor body, while maintaining electrical isolation. Here, in the wiring pattern shown in FIG. 1B, the voltage detection terminal wiring 8 enters the back side of the circuit board through a via-hole 10*a*, bends at right angles and returns again to the front side of the circuit board through a via-hole 10*b*. It follows that wiring pattern 8 disposed on the backside intersects voltage detection terminal wiring 9 on the backside of the circuit board.

According to the configuration described above, as shown in FIG. 1E, the current path in the resistor body 1 and the voltage detection terminal wirings 8, 9 extending from the Kelvin terminals (voltage detection terminals 8*a*, 9*a*) are coupled magnetically through mutual-inductance M. Therefore, in the voltage detected between the Kelvin terminals (voltage detection terminals 8*a*, 9*a*), the error voltage, proportional to the time-dependent change in the current flowing in the current path in the resistor body caused by self-inductance Lr/2 is cancelled by a voltage generated by the mutual-inductance M.

From the equivalent circuit shown in FIG. 1E, the voltages Vi, Vo at the corresponding Kelvin terminals 8*a*, 9*a* is expressed as follows:

$$Vi = Vref + I \times R + Lr \times (dI/dt) - M \times (dI/dt)$$

$$Vo = Vref + M \times (dI/dt)$$

$$\therefore Vi - Vo = I \times R + Lr \times (dI/dt) - 2 \times M \times (dI/dt)$$

By adjusting the length of the voltage detection terminal wiring so that $$Lr-2\times M=0,$$

then, $$Vi-Vo=I\times R$$

so that, the error voltage caused by inductance Lr of the resistor body 1 is completely compensated, yielding a detected voltage produced by an ideal current detection resistor device.

Figure 2:
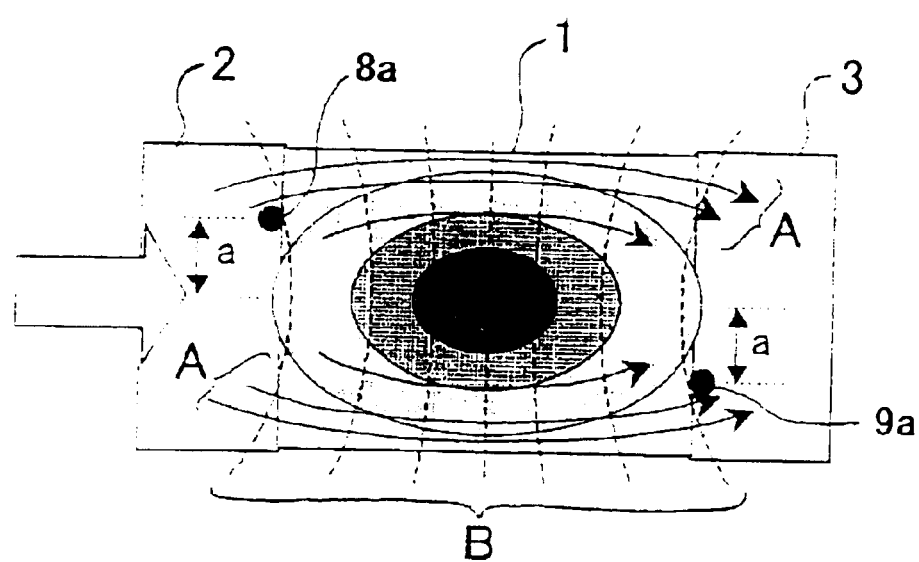
FIG. 2 is a bottom view of a variation of the current detection resistor device in a second embodiment of the invention.

FIG. 2 shows a diagram of a second embodiment of the invention. As shown in FIG. 2, the current detection resistor device generates heat when the current flows and its temperature distribution is the highest at the center section. Here, assuming that the temperature coefficient of resistance of the resistor body 1 is positive, the resistance value of the center section becomes higher than the values in the surrounding so that the current concentrates in the surrounding regions as shown by the arrow A. The current is orthogonal to the equi-potential surface so that the equi-potential surface B becomes curved. The equi-potential surface B is determined when equilibrium is attained among the variables, namely variation of current value→variation of heat distribution→variation of resistance distribution. Therefore, for various values of the current, portions that show little variation in the resistor body resistance (equi-potential difference÷current value) are produced symmetrically about the central axis. When the lead wires of the Kelvin terminals and the main current electrodes are joined at such a location, it is possible to reduce current detection errors due to resistance variation caused by temperature coefficient of resistance.

That is, the Kelvin terminals are placed so as to be separated in opposing directions of the central axis extending along the measuring current flowing from the current measuring electrodes 2, 3 of the resistor body 1. For example, in the example shown in the diagram, the locations of the Kelvin terminals 8a, 9a of the current measuring electrodes should be chosen so that they are separated by a distance "a" from the central axis extending along the flow direction of the current to be measured to maintain the ratio between potential difference V and current I substantially constant for various values of I. Here, in this embodiment also, the wiring pattern shown in FIG. 1B is used, and it is preferable to extend the lead wiring patterns first extending along current path while maintaining electrical isolation from the resistor body 1, and then to be bent away at right angles. This arrangement will provide the same compensation effect due to induced voltage by inductance as in the first embodiment.

Figure 3A:
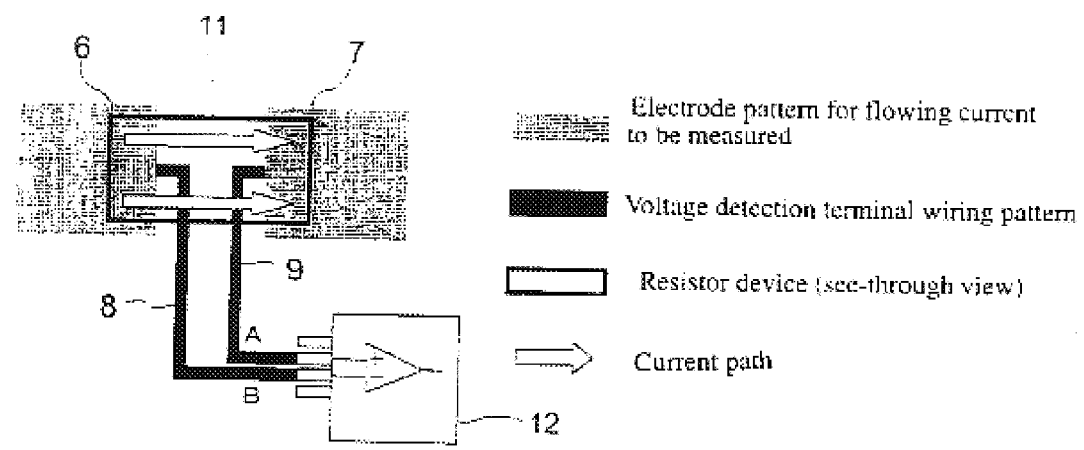
FIG. 3A is a diagram to show an example of the current detection circuit in a first embodiment to detect the current flowing in the current detection resistor device to be measured.
Figure 3B:
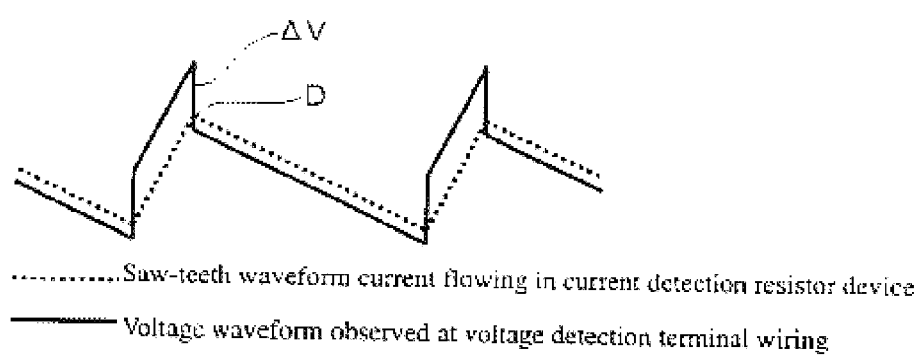
FIG. 3B is a diagram showing an example of the saw-teeth waveform current flowing in the current detection circuit and an example of the voltage waveform at the voltage detection terminal wiring.

FIG. 3A shows an example of the detection circuit in a first embodiment for detecting the current to be measured through the current detection resistor device. Both ends (electrodes) of the resistor device 11 are respectively fixed to the lands 6, 7, and a current I is input into the resistor device 11. Then, the magnitude of the current I is detected from measurements of the potential difference (voltage) at the voltage leads of the lands fixed to the ends of the resistor body by using the known proportional relationship between the current and voltage. When detecting the current to be measured I, the potential difference $V_{AB}$ extracted from the point A and point B in FIG. 3A is, ideally a product of the resistance value R of the resistor body and the current to be measured I. However, in reality, the parasitic inductance L of the resistor body generates a voltage, $L\times(dI/dt)$, that corresponds to the time-dependent variation of the current to be measured I, thereby producing detection errors in the voltage measurements. That is, saw-teeth waveform current flow shown by the dotted line passes through the resistor device 11, as shown in FIG. 3B, thus generating a voltage change ΔV at the apex section D of the current waveform.

The voltage appearing at the voltage detection terminal wirings 8, 9 is input into a voltage comparator or a voltage amplifier 12, as shown in FIG. 3A to detect the voltage difference value. However, because the resistor body has self-inductance L as described above so that the wiring pattern (voltage detection terminal wiring pattern) magnetically couples with the current I flowing in the current path, so that the actual voltage difference $V_{AB}$ becomes:

$$V_{AB}=R\times I+L\times(dI/dt)-M\times(dI/dt),$$

Figure 4:
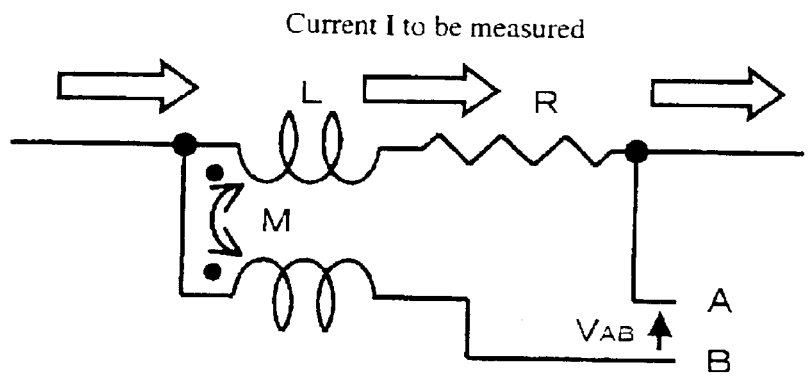
FIG. 4 is a diagram of an equivalent circuit of a resistor device to be measured and voltage detection terminal wiring.

Where, M is the mutual-inductance shown in the equivalent circuit in FIG. 4. The current flowing to the voltage comparator or voltage amplifier 12 is negligibly small compared with the current to be measured I so that it may be ignored, and therefore, it is not included in the equation shown above. The quantity (L−M) is the effective inductance that generates error for the current detection resistor device, so that it may be expressed as Le to indicate that it is the effective inductance, then, $$Le=L-M$$

$$V_{AB}=R\times I+Le\times(dI/dt),$$

it results in a simpler expression. Here, $Le\times(dI/dt)$ represents, in effect, an error voltage ΔV.

Figure 5:
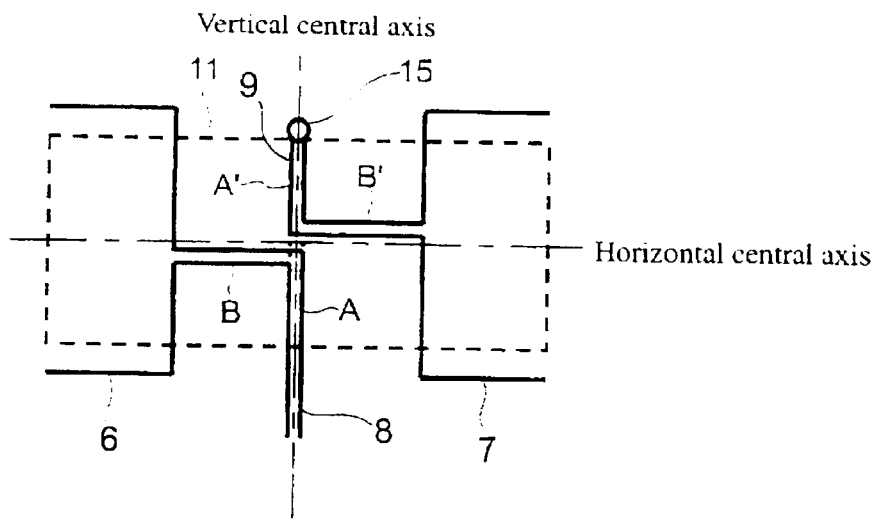
FIG. 5 is a diagram to show an example of the structure of the voltage detection terminal wiring pattern.

FIG. 5 shows an embodiment of the voltage detection terminal wiring for detecting the voltage generated at the both ends of the resistor device 11. The electrodes of the resistor device 11 are fixed to the lands 6, 7, and the voltage detection terminal wirings 8, 9 are extended from the lands 6, 7. The effective inductance Le is determined by the configuration of the current detection resistor device and the voltage detection terminal wiring pattern on which the device is mounted. It follows that it is preferable to form a pattern, such as the one shown in FIG. 5 that enables to subtract the mutual-inductance from the self inductance so as to produce virtual zero effective inductance Le. The reason will be explained below.

The voltage detection terminal wirings 8, 9 for voltage measurement are extended along the horizontal central axis (center axis of each land) to follow the direction of the current flow to the central section of the resistor device 11, shown as B, B' in the diagram. And, after being bent at the central axis (vertical central axis) between the respective lands, shown as A, A' in the diagram, one lead wiring connects to the back pattern by folding back through the via-hole 15, and extends parallel to the back surface along the vertical central axis. That is, the wiring pattern A of the voltage detection terminal wiring that extends only on the front surface of the circuit board superimposes on the wiring lead A' that leads to the back surface through the via-hole 15 across the insulation layer of the circuit board, so that both wiring patterns are extended in the vertical direction. Accordingly, by superimposing the wiring patterns as described above, the loop formed by both voltage detection terminal wirings 8, 9 does not cross the magnetic fluxes formed by the current flowing through the resistor body 11 and through the voltage detection terminal wiring, so that the mutual-inductance M in FIG. 4 becomes independent of the length of the lead pattern. Then, after extending the lead pattern in the superimposed condition sufficiently to a location to minimize the effect of magnetic interaction produced by the current flows passing through the resistor device and the measuring pattern, the voltage is detected by the voltage detector 12 by connecting to the litz line and the like.

Figures 6A, 6B:
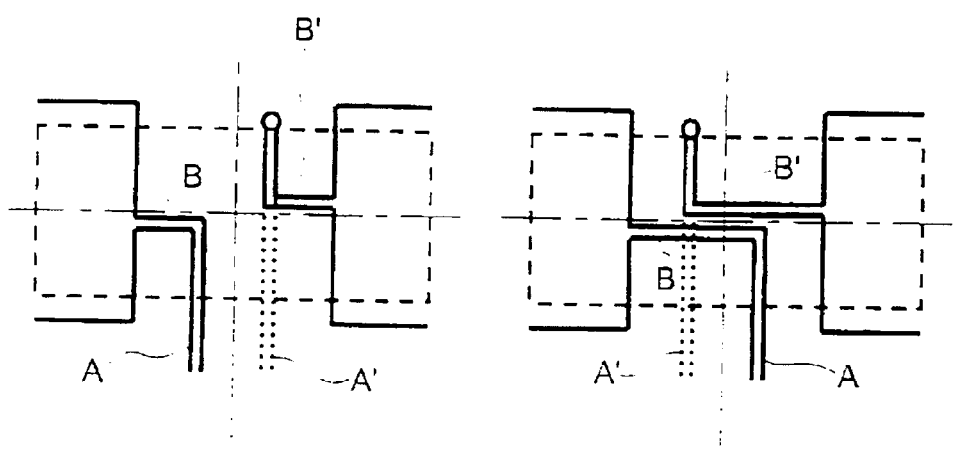
FIGS. 6A and 6B are another examples of the structure of the voltage detection terminal wiring pattern in comparison to the example shown in FIG. 5.

The voltage detection terminal wirings should be as fine as possible in a range of 0.2~0.3 mm, and the horizontal patterns B, B' of the voltage detection terminal wiring should be disposed along the horizontal central axis as close as possible, and it is preferable that the vertical patterns A, A' of the voltage detection terminal wirings be disposed coincident with the center line of the vertical axis. As shown in FIG. 6A, when the vertical patterns of the voltage detection terminal wirings are moved away from the central axis, mutual-inductance M is reduced thereby increasing the effective inductance Le. Conversely, when the vertical patterns of the voltage detection terminal wirings are extended beyond the central axis, as shown in FIG. 6B, mutual-inductance M is increased, and if it exceeds the self-inductance, the effective inductance Le becomes negative.

Therefore, it becomes important to align the vertical patterns A, A' of the voltage detection terminal wirings with the vertical central axis so as to reduce the effective inductance Le and to prevent excessive coupling such as the one shown in FIG. 6B. That is, in such a case, the length of wirings B, B' of the voltage detection terminal wirings becomes substantially equal to the length of self-inductance of the resistor device, therefore, it becomes possible to subtract, in effect, mutual-inductance portion due to voltage detection terminal wirings from the self-inductance portion. If it is desired to compare resistor devices by measuring the effective inductance Le in general, it is necessary to devise a voltage detection terminal wiring pattern that enables to reproduce effective inductance Le under minimal requirements with good repeatability, and furthermore, to prevent adverse effects of noise such as external magnetic flux. In this point, the above pattern precisely fills such requirements.

Effective inductance Le measured by using such a wiring pattern serves as a benchmark for deciding whether the current detection resistor device can be used for current detection without measuring errors and without depending on additional compensating circuits. Also, it is preferable that the insulation layer disposed between the superimposed front and back voltage detection terminal wirings 8, 9 be as thin as possible to minimize the voltage error. The shape of the lands 6, 7 varies depending on the shape of the electrodes of the current detection resistor device so that it is preferable to use a shape compatible with the electrode shape of the current detection resistor device.

The value of the effective inductance Le obtained by using such a wiring pattern not only serves as a practical index to represent the general performance quality of the current detection resistor device but also for designing the resistor device itself. That is, if the current path of the low resistance resistor device is straight, and, as shown in FIG. 5, if the patterns B, B' extend to the vertical central axis where they are bent, the self inductance of the resistor device becomes substantially equal to the mutual-inductance, and the effective inductance Le becomes essentially zero. If the current path is curved due to trimming and other adjustments, self-inductance does not become equal to mutual-inductance and the effective inductance Le exhibits a value of about 1 nH, for example. If a specific pattern is specified for mounting, it is, of course, possible to use a pattern different than a common pattern. However, in such a case, a value so obtained may not universally be applied, but the value will be applicable directly for design purposes.

Next, with reference to FIGS. 7 and 8, an example of the structure of the measuring circuit will be explained, using the voltage detection terminal wiring patterns described above for actual measuring of the effective inductance.

Figure 7:
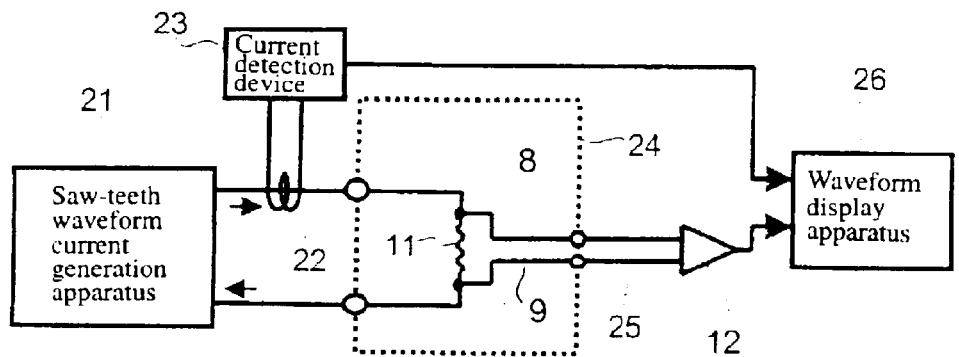
FIG. 7 is a block diagram of the apparatus for measuring the effective inductance in the current detection resistor device in an embodiment.

FIG. 7 shows a measuring apparatus for measuring the effective inductance of the current detection resistor device. Saw-teeth waveform current from a customized generation source 21, for generating a saw-teeth waveform current to correspond to the actual application, is supplied to a target resistor device 11. From the saw-teeth waveform current generation apparatus 21, it is possible to supply saw-teeth waveform current at several amperes to several tens of amperes, for example, at a period of 2.5 $\mu$s to the target resistor device 11 having less than several mili-ohms. Wiring 22 supplying the saw-teeth waveform current to the resistor device 11 is provided with a current detection device 23 such as a current probe for detecting the flow of current by coupling to the wiring 22. The resistor device 11 is mounted on a circuit board 24, shown in FIG. 5, which is customized to have the voltage detection terminal wiring pattern, and a voltage generated by the saw-teeth waveform current is taken out from the voltage detection terminal wiring 8, 9 connected to each end of the resistor device 11. The voltage generated at both ends of the voltage detection terminal wiring 8, 9 on the circuit board 24 is connected through litz wire 24 and others, to the voltage detection device 12 comprised by differential amplifier and the like. Thus, the voltage generated at both ends of resistor device is detected. The outputs from the current detection device 23 and the output from the voltage detection device 12 are input into a waveform analyzer 26 such as an oscilloscope, and the results are displayed according to voltage or current unit as appropriate.

Figure 8:
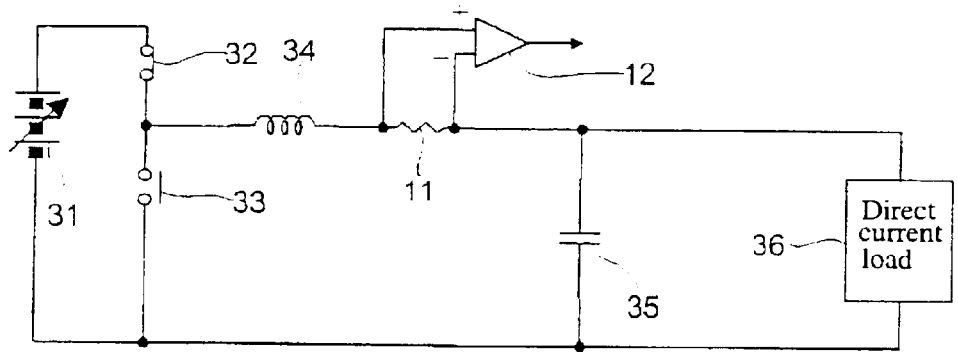
FIG. 8 is a circuit diagram of a specific example of the circuit shown in FIG. 7.

FIG. 8 shows an example of a measuring circuit. For example, +12 volt direct current source is switched by alternately using switching elements 32, 33 to supply the current, alternately from positive to negative, to an integration circuit comprised by a choke coil 34 and a condenser 35. By adjusting the inductance of the choke coil, the capacitance of the condenser, switching frequency and the duty factor, saw-teeth waveform current shown by the dotted line in FIG. 3B is supplied to the current detection resistor device 11. A range of several to several tens of dc-amperes at about 1 dc-volt, for example, is supplied to direct current load 36 by adjusting its resistance value.

The conditions that need to be fulfilled by the measuring circuit include, in addition to the capabilities for adjusting as described above, a condition that the saw-teeth waveform current of good linearity and constant amplitude is generated, when a constant voltage of different polarities is alternately applied to an unsaturable choke coil. Also, it is desirable that the in-phase voltage elimination ratio of the differential amplifier for detecting the end voltages at the voltage detection terminal wiring be as high as possible. Further, the choke coil and the target current detection resistor device should be placed at a distance to ensure that magnetic flux leakage from the choke coil does not affect the current detection resistor device within its measuring error range, or a magnetic shield should be placed between the two devices to achieve the same effect. Also, the voltage detection terminal wirings 8, 9 superimposed on the front and back surfaces of the circuit board shown in FIG. 5 are extended to the input section of the differential amplifier 12, but the current path should be extended in alignment to a location that does not receive external magnetic flux, or if it is necessary to use a wire member to extend the reach, litz wire should be used to prevent intrusion of external magnetic flux between the wires. It should also be noted that the current waveform should be observed using a current probe or current transformer and the like having sufficient bandwidth that are responsive to high frequencies of harmonics of switching waveform.

Figure 9:
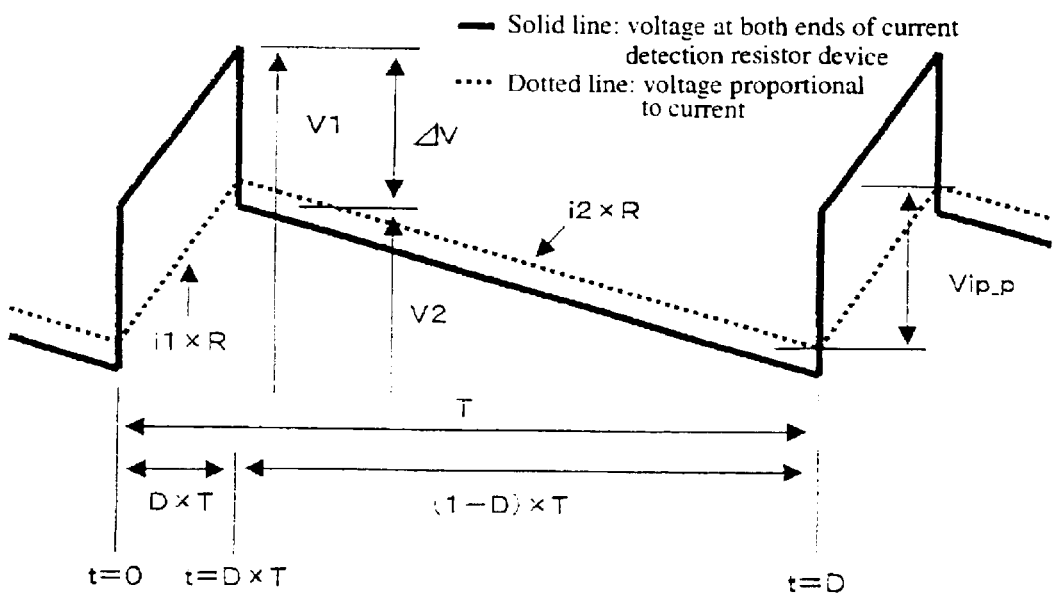
FIG. 9 is a diagram to show the waveforms of current and voltage for computing the effective inductance value Le.

Next, measuring procedure for computing effective inductance Le will be explained with reference to FIG. 9.

Measuring of effective inductance Le of a current detection resistor device is carried out by supplying saw-teeth waveform current to a target resistor device 11 and detecting the current and the voltage generated by the current by coupling to both ends of the resistor device. Then, the effective inductance is computed from the variations in the saw-teeth waveform current and the corresponding voltages.

First, at the apex of change of the saw-teeth waveform current, a voltage change ΔV, for resistance R of the resistor device, duty cycle D, period T, current flows i1 and i2, are expressed as:

$$\Delta V = V1 - V2 = i1 \times R + Le(di1/dt) - i2 \times R - Le(di2/dt), \text{ and}$$

for $t = D \times T$, $i1 = i2$, so that $$\Delta V = Le(di1/dt) - Le(di2/dt).$$

Designating the change in current variation by Vip_p $$(di1/dt) = Vip\_p/(R \times D \times T) \text{ and}$$

$$(di2/dt) = -Vip\_p/\{R \times (D-1) \times T\}$$

so that, upon transposing, $$\Delta V = \frac{Le}{T} \times \frac{Vip\_p}{R} \times \frac{1}{D} \times \frac{1}{1-D}$$

and $$Le = \frac{\Delta V \times T}{Vip\_p \ R} \times D \times (1-D)$$

are obtained.

Because Vip_p and ΔV are obtained from waveform analyzer and the like, the effective inductance Le can be computed for the resistor device.

Figure 10A:
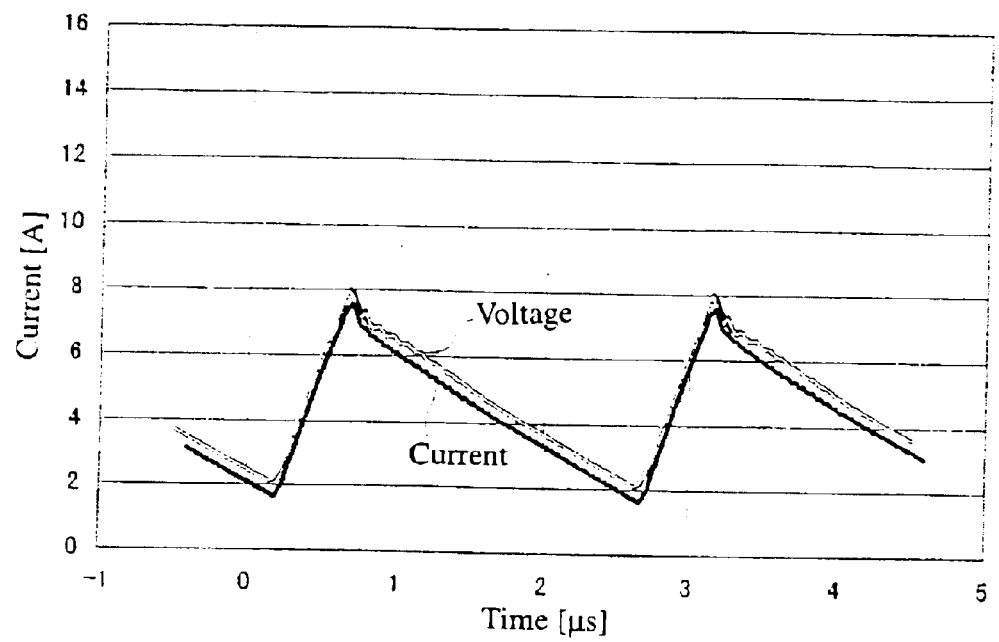
FIG. 10A is a diagram to show the waveforms of current and voltage of a low resistance resistor device that has virtually no effective inductance and FIG. 10B is a graph to show an example of measuring the effective inductance value.
Figure 10B:
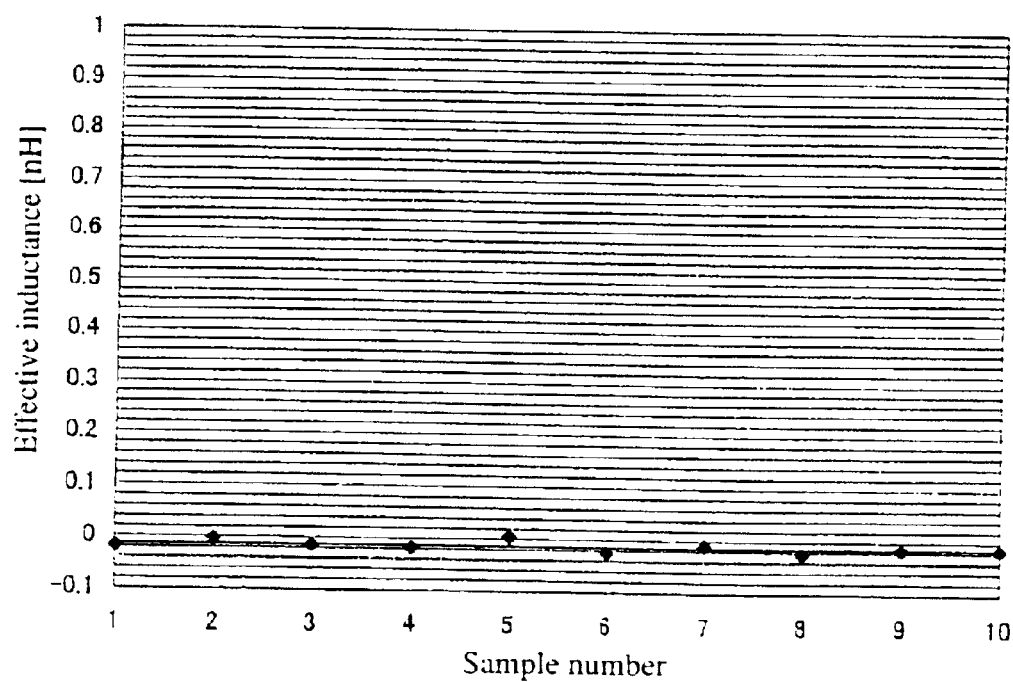

FIGS. 10A, 10B and FIGS. 11A, 11B show actual measurements for the effective inductance Le of the low resistance resistor device obtained by using the measuring apparatus and the wiring pattern described above. FIGS. 10A and 10B show the results related to a resistor device constructed in such a way that a resistance value is 2 mΩ for a linear current path, and the distance from the mounting printing base to the current path is made short so as to minimize the effective inductance. It can be seen in FIGS. 10A and 10B that, by using the mounting structure shown in FIG. 5, although self-inductance is present for the resistor device itself, it is cancelled out by the voltage detection terminal wiring and mutual-inductance, so that the current waveform are roughly coincident with the voltage waveform. And, as demonstrated by measurements on ten samples shown in FIG. 10A, the effective inductance Le is virtually matched. And, as shown in FIG. 10B, the results of measuring ten samples show that the effective inductance Le is essentially zero.

Figure 11A:
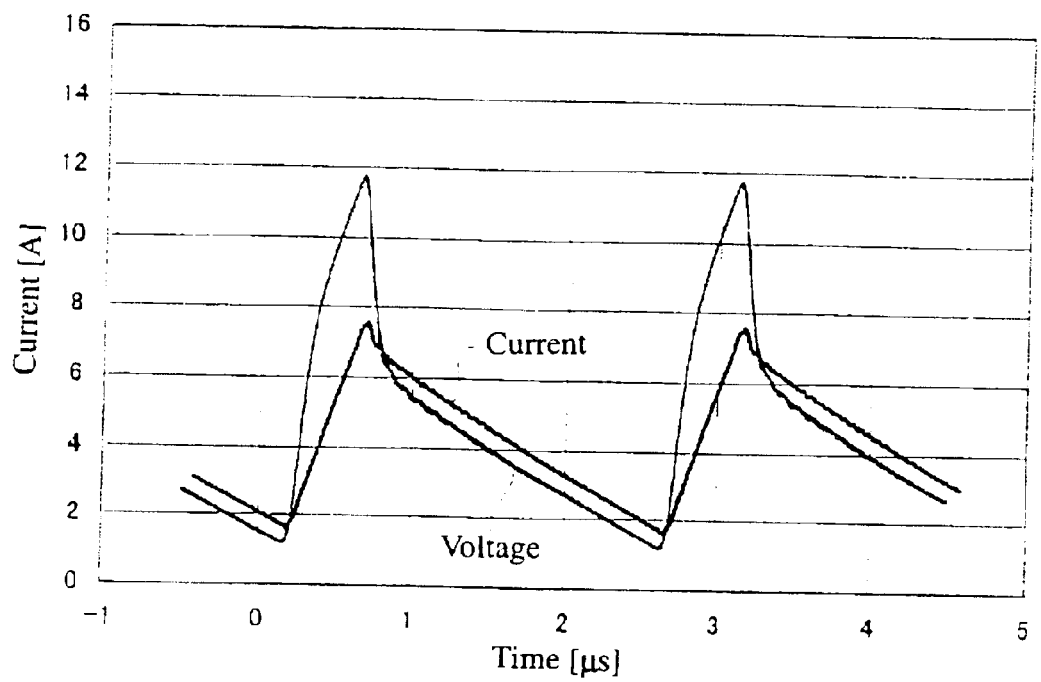
FIG. 11A is a diagram to show the waveforms of current and voltage of a low resistance resistor device that has effective inductance.
Figure 11B:
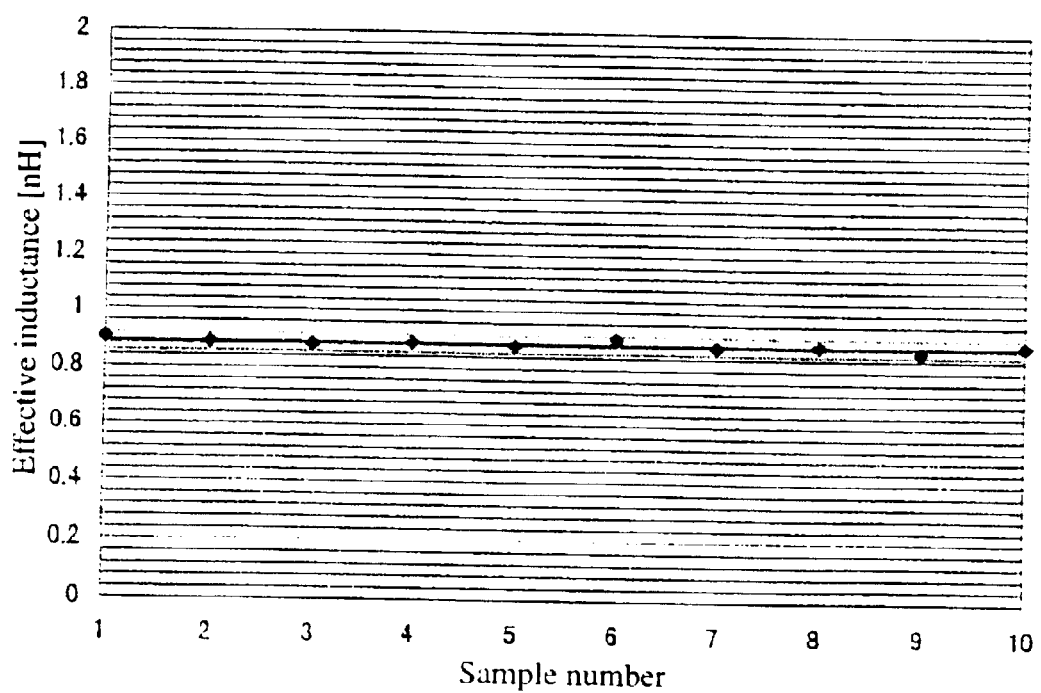
FIG. 11B is a graph to show an example of measuring the effective inductance value.

In contrast, FIGS. 11A and 11B show the results related to a resistor device having a resistance value of 3 mΩ and the current path has been bent by vertical trimming. It can be seen in FIG. 11A that a large error voltage is generated in the saw-teeth waveform current. In this case, as shown in FIG. 11B, in this low resistance resistor device, by using the mounting structure shown in FIG. 5, the effective inductance Le is substantially zero when the current path of the resistor device interior is linear, therefore, in the resistor device having a curved current path due to resistance trimming, it can be seen that self-inductance is increased. Therefore, self-inductance Le is present at a level of about 0.9 nH in this resistor device.

Figure 12:
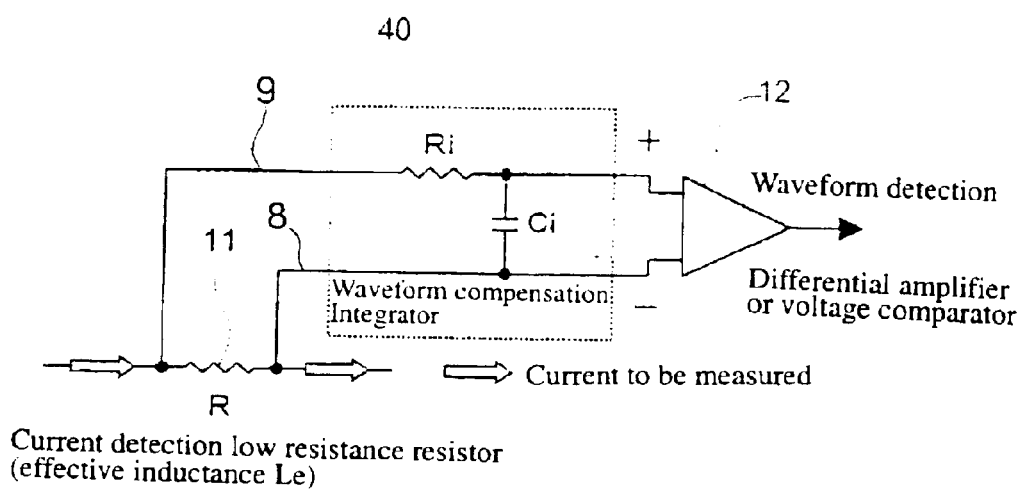
FIG. 12 is a circuit diagram for a voltage detection circuit provided with a compensating circuit containing CR elements for a low resistance resistor device that exhibits effective inductance.

As shown in FIGS. 11A and 11B, when the effective inductance Le is high, combined impedance of the low resistance resistor device becomes high, resulting in generation of large error voltage in the detected voltage, as described above. Therefore, if a DC/DC converter is controlled according to such a detected voltage waveform, its operation is impaired. Therefore, it is desirable to insert a suitable filtering circuit in the voltage detection terminal wiring to eliminate error waveform caused by effective inductance so as to output voltage waveform caused only by the resistance component. FIG. 12 shows a waveform compensating integrator 40 to serve as a filter for eliminating the error voltage waveform. This integrator is comprised by a resistance Ri and a capacitance Ci, and is represented by a relation:

$$Ci \times Ri = Le/R.$$

Therefore, it is possible to eliminate the error voltage waveform shown in FIG. 11A.

Next, a third embodiment of the present invention will be explained in detail with reference to FIGS. 13 through 20.

Figure 13A:
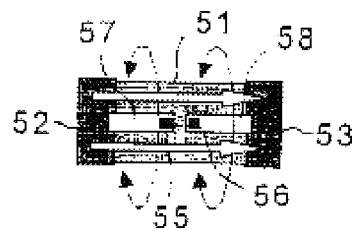
FIG. 13A is a bottom view of a current detection resistor device in a third embodiment.
Figure 13B:
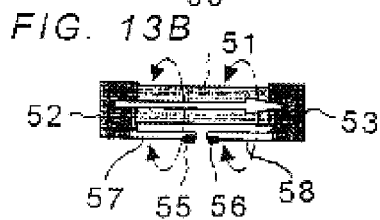
FIG. 13B is a side view thereof.
Figure 13C:
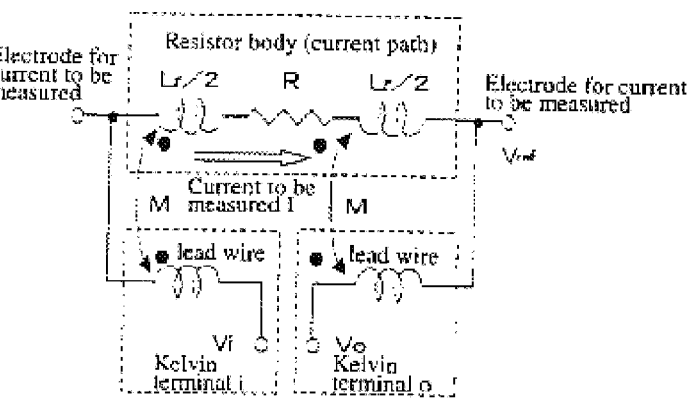
FIG. 13C is a diagram of an equivalent circuit thereof.

FIGS. 13A and 13B show a bottom view and side view of the structure of the current detection resistor device in the third embodiment, and FIG. 13C shows its equivalent circuit. The current detection resistor device is provided with electrodes 52, 53 in the longitudinal direction of the resistor body 51 comprised by a copper-nickel alloy, for example. Current to be measured flows between the electrodes 52, 53, and a potential difference generated by the resistor body is measured between the Kelvin terminals 55, 56. In this mounting structure, lead wires 57, 58 from the target current measuring electrodes 52, 53 of the voltage detection terminals (Kelvin terminals) 55, 56 are extended along the surface of the resistor body in the direction of the target current path (shown by white arrows in the diagrams) of the resistor body 51 while maintaining electrical isolation from the resistor body 51. Kelvin terminals 55, 56 are positioned at the ends so that the wiring for the measuring system formed on the printed circuit board is at right angles to the target current path. The lead wires 57, 58 may be placed in the central section of the resistor body 51 in the current flow direction, as shown in FIG. 13A, or it may be placed on a side surface of the resistor body 51, as shown in FIG. 13B. In either case, it is possible to provide magnetic coupling (shown by arrow in the diagram) by placing the lead wires near the resistor body in such a way to lay parallel to the current flow direction while maintaining electrical isolation.

By adopting the structure described above, the current path of the resistor body 51 and the lead wires 57, 58 of the Kelvin terminals couple with each other by mutual-inductance M as shown in FIG. 13C. Therefore, the voltage detected between the Kelvin terminals 55, 56 reflects the canceling effects due to the voltage produced by the mutual-inductance M of the current path on the error voltage, which is proportional to the time-dependent variation in the current flow.

From the equivalent circuit shown in FIG. 13C, the voltage Vi, Vo can be expressed by the following expressions:

$$Vi = Vref + I \times R + Lr \times (dI/dt) - M \times (dI/dt)$$

$$Vo = Vref + M \times (dI/dt)$$

$$\therefore Vi - Vo = I \times R + Lr \times (dI/dt) - 2 \times M \times (dI/dt)$$

By adjusting the length of the Kelvin terminal lead wires so that $$Lr-2\times M=0,$$

then, $$Vi-Vo=I\times R$$

and the error voltage caused by the inductance Lr associated with the self-inductance of the resistor body 51 is completely compensated to provide an ideal current detection resistor device.

Figure 14A:
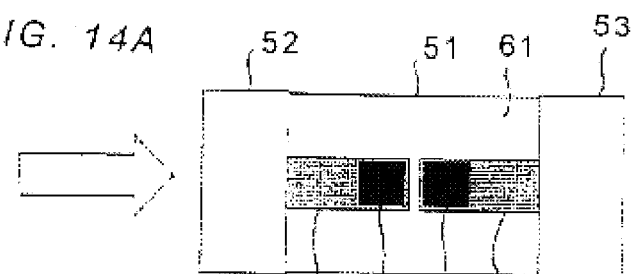
FIG. 14A is a bottom view of a variation of the current detection resistor device of the present invention.
Figure 14B:
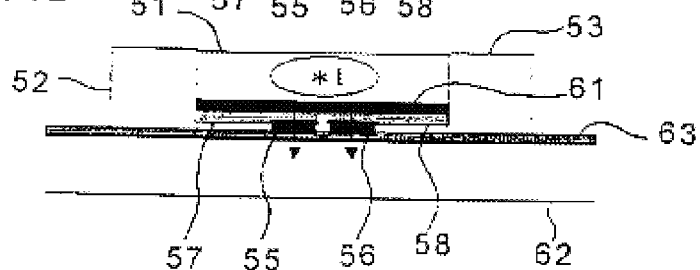
FIG. 14B is a side view thereof.

FIGS. 14A and 14B show a variation of the mounting structure of the present invention. FIG. 14A shows a bottom view of the current detection resistor device and FIG. 14B shows a side view of the current detection resistor device. In this mounting structure, an insulator body 61 having good thermal conductivity is placed on the lower surface of the resistor body 51 of the current detection resistor device, then the Kelvin terminal lead wires 57, 58 connected to the electrodes 52, 53 are placed on its lower surface such that the Kelvin terminals 55, 56 are disposed at the tips of the respective lead wires 57, 58. The Kelvin terminals 55, 56 are firmly connected to the wiring pattern 63 on the printed circuit board 62, which serves to affix the current detection resistor device.

When the current is made to flow in the resistor body 51, greatest heat due to Joule heating is produced near the mechanical center of the resistor body 51. As shown in FIGS. 14A, 14B, it is possible to drain the heat from the hot spot to the circuit board 62 effectively by extending the Kelvin terminals 55, 56 directly below the hot spot of the resistor body 51 and by thermally coupling the Kelvin terminal lead wires 57, 58 to the resistor body 51 by using the insulator body 61 of high thermal conductivity. By adopting this structure, it is possible to restrain temperature rise in the resistor body 51, thereby minimizing current detection errors related to the temperature coefficient of resistivity. It should be noted that, although it is preferable to place the Kelvin terminals near the hot spot by placing the insulator body 61 of high thermal conductivity on the lower surface of the resistor body 51, the heat of the resistor body 51 may also be drained to the circuit board 62 through the insulator body 61, lead wires 57, 58, and Kelvin terminals 55, 56, by shortening the lead wires 57, 58 and placing the Kelvin terminals 55, 56 towards the electrodes 52, 53.

Figure 15:
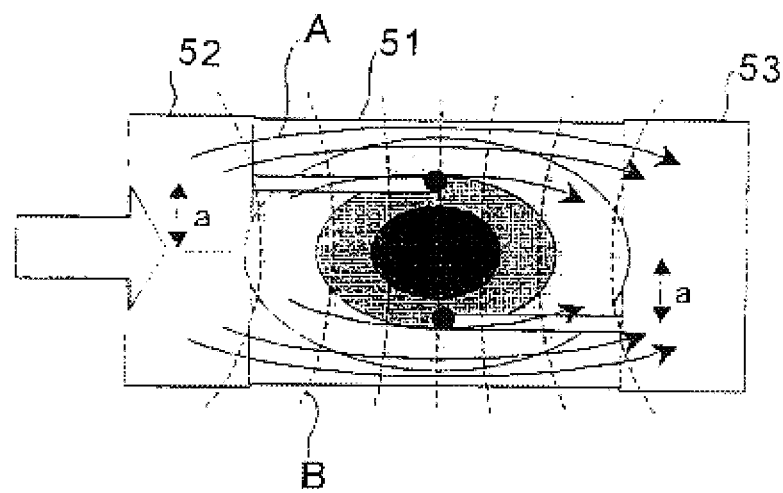
FIG. 15 is a bottom view of a variation of the current detection resistor device of the present invention.

FIG. 15 shows another variation of the current detection resistor device.

As shown in FIG. 15, heat is generated when the current to be measured is made to flow in the current detection resistor device, the highest temperature is obtained in the center section. Assuming that the temperature coefficient of resistance of the resistor body 51 is positive, the resistance in the center section becomes higher compared with surrounding so that the current distribution becomes more dense near the periphery, as shown by an arrow A. Because the current flow is at right angles to the equi-potential planes, equi-potential surface B is a curved surface. The equi-potential surface is formed when equilibrium is established in the process of "change in current→change in heat distribution→change in resistance distribution". For various amounts of current flow, regions that show small change in the value of resistor body (obtained by dividing the difference in equi-potentials with magnitude of current) are formed symmetrically about the center axis on the outside of the center axis. Current detection errors caused by resistance variation associated with the temperature coefficient will be minimized by locating the electrical joint section between Kelvin terminal lead wires and main current electrodes in such regions.

That is, the feature of the invention is that the lead sections from the current electrodes of the Kelvin terminals are offset to a location "a", which is shifted from the center axis along the current to be measured flow in the resistor device. For example, in the illustrated example, the lead sections from the target current electrodes of the Kelvin terminals are distanced at "a" from the center in the target current flow direction of the resistor body so that a quantity "potential difference V/current I" is substantially constant for various values of the current flow I. Here, in this embodiment also, it is permissible to place the insulator body of good thermal conductivity on the lower surface of the resistor body 51, such as the ones shown in FIGS. 14A and 14B so as to drain the heat to the circuit board 62.

Figure 16A:
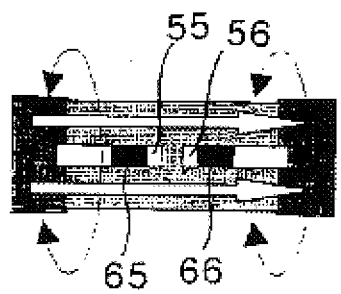
FIG. 16A is a bottom view of another variation of the current detection resistor device of the present invention.
Figure 16B:
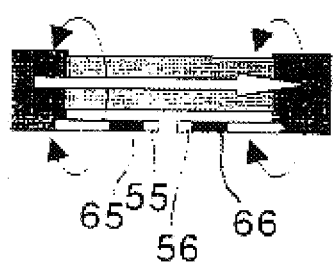
FIG. 16B is side view thereof.

FIGS. 16A and 16B show a variation of the current detection resistor device of the present invention. In this resistor device, impedance matching resistors 65, 66 are inserted in the lead wires 57, 58 that electrically connect the Kelvin terminals 55, 56 and the target current electrodes 52, 53 so that the output impedance of the pair of Kelvin terminals as the signal source is matched to the characteristic impedance of the circuit pattern on the circuit board to which the Kelvin terminals are connected. However, it should be noted that the lead wires 57, 58 and the Kelvin terminals 55, 56 are electrically isolated from the resistor body 51. When the time-dependent variation in the current to be measured increases, in other words, when the signal contains high frequency components, the detected voltage between the Kelvin terminals becomes distorted while propagating to the input terminal of the signal processing circuit. To reduce such a distortion, it has been a practice to insert a lowpass filter in the signal processing circuit to adjust the waveform. However, when it is necessary to transmit detected voltage signal containing very high frequency components to the signal processing circuit, the high frequency transmission capability of the circuit is in a trade-off relation to the distortion reducing capability of the lowpass filter.

Figure 16C:
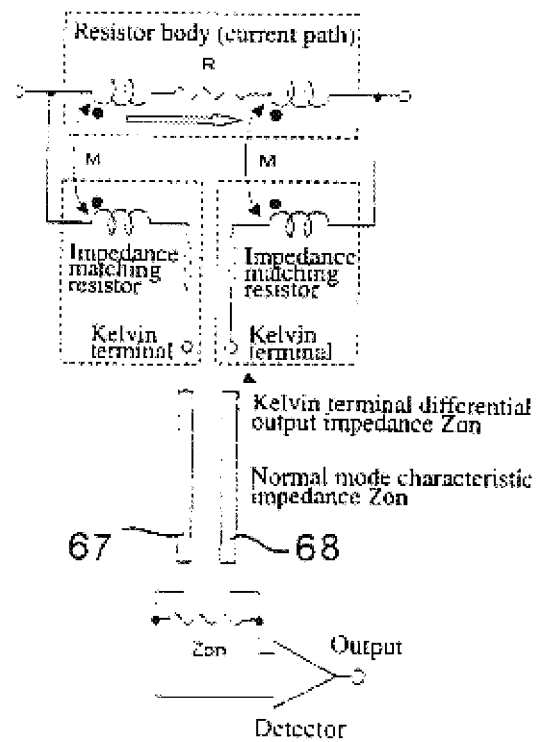
FIG. 16C is a diagram of an equivalent circuit thereof.

As shown in FIGS. 16A and 16B, by inserting impedance matching resistor bodies 65, 66 near the Kelvin terminals 55, 56, the lead wires 57, 58 are given some impedance. As shown in FIG. 16C, the normal mode output impedance at the differential voltage transmission lines 67, 68 to the detection device including the device impedance is matched to the normal mode characteristic impedance of the patterns of the circuit board so as to terminate the input signal to the detection device at the same impedance level. By so doing, impedance matching is achieved between the output impedance at the Kelvin terminals and the input impedance into the detection device fabricated on the circuit board, resulting in distortion-free transmission of detected waveform to the input terminal of the signal processing circuit.

Figure 17A:
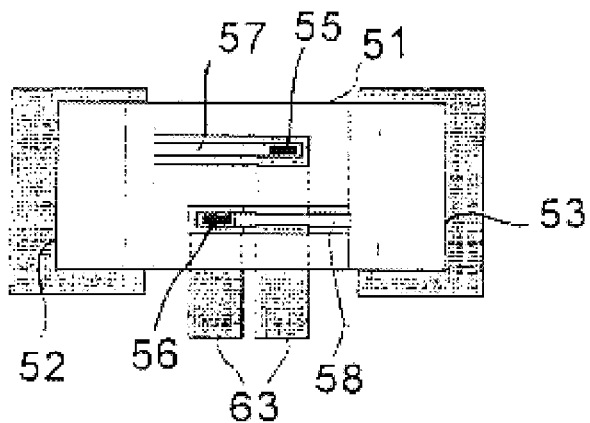
FIG. 17A is a bottom view of an example of the lead wire configuration.
Figure 17B:
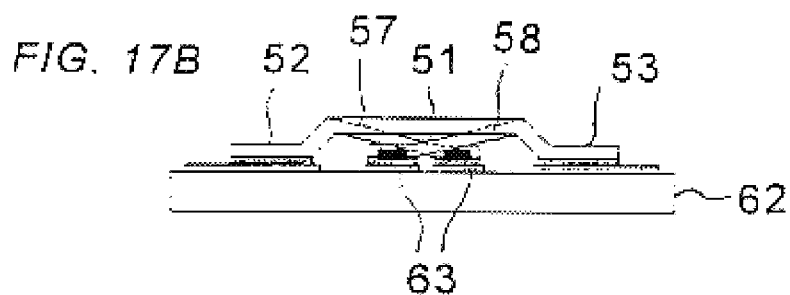
FIG. 17B is a side view thereof.

FIGS. 17A and 17B show an embodiment of the lead wires provided with Kelvin terminals. In this embodiment, the lead wires 57, 58 having Kelvin terminals 55, 56 are formed by punching the resistor body 51 serving as the mother member and bending the punched strip member. The base portions of the lead wires 57, 58 are located near the electrodes 52, 53. The Kelvin terminals 55, 56 are extended so that they are at right angles to the direction of current flow in the wiring 63 provided on the circuit board 62. Here, the Kelvin terminals 55, 56 may be made of a low resistivity material such as a metallic plates or a material same as the resistor body for the current detection device. Such metallic plates are affixed to the end section of the lead wires 57, 58 by such means as spot welding. The connections to the wiring pattern 63 on the circuit board 62 are made by means such as soldering.

Figure 18A:
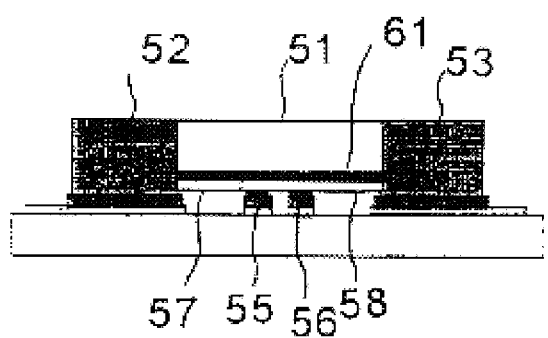
FIG. 18A is a side view of another example of the lead wire configuration.
Figure 18B:
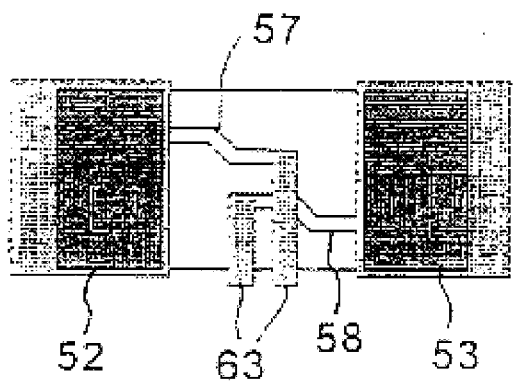
FIG. 18B is a bottom view thereof.

FIGS. 18A and 18B show another embodiment of the lead wire configuration. An insulator body 61 having good thermal conductivity is disposed between the electrodes 52, 53 on the back surface of the resistor body 51. The insulator body 61 is comprised by a thin glass layer or a polyimide resin layer and the like, for example, and the lead wires 57, 58 are placed on its lower section. Lead wires 57, 58 are formed by affixing a metallic film or metallic strip, formed by evaporation, sputtering, screen-printing, coating or plating and the like, to be connected to the electrodes 52, 53. Kelvin terminals 55, 56 are affixed to the end sections of the lead wires 57, 58. They are then connected so that the wiring 63 disposed on the circuit board 62 is at right angles to the direction of current flow through the resistor body 51.

Figure 19A:
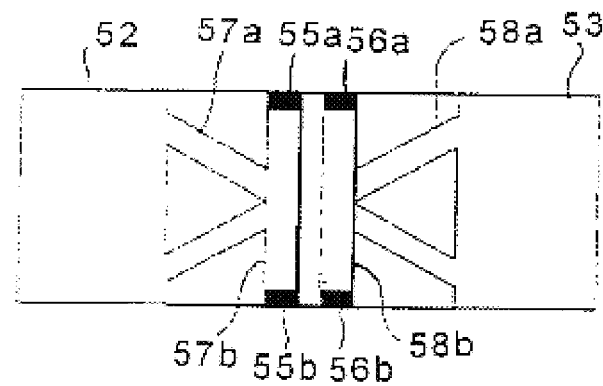
FIG. 19A is a bottom view of still another example of the lead wire configuration.
Figure 19B:
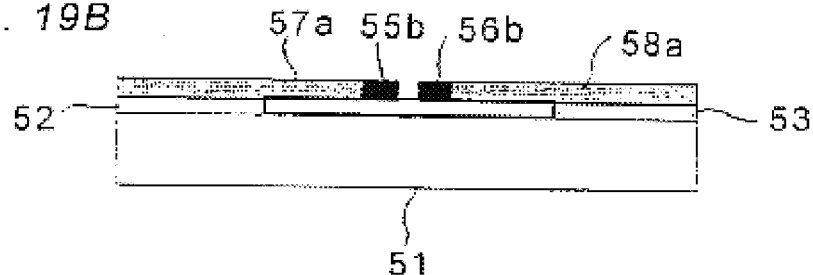
FIG. 19B is a side view thereof.

FIGS. 19A and 19B show an example of the variation of the lead wires shown in FIGS. 18A and 18B, and is comprised by truss-shaped portions 57a, 58a and vertical portions 57b, 58b that are at right angles to the current flow direction. Kelvin terminals 55a, 56a and 55b, 56b are disposed respectively on each end of the lead wires 57b, 58b. Positioning the lead wires in a manner resembling a truss (crossing) enables to prevent generation of errors caused by current distribution within the resistor body 51, and enables to measure the voltage stably. However, the voltage detection terminals 55, 56 and the lead wires 57, 58 are electrically isolated from the resistor body 51. The electrode 52 is electrically connected to the voltage detection terminals 55a, 55b by way of the lead wires 57a, 57b. Also, the electrode 53 is electrically connected to the voltage detection terminals 56a, 56b by way of the lead wires 58a, 58b.

Figure 20A:
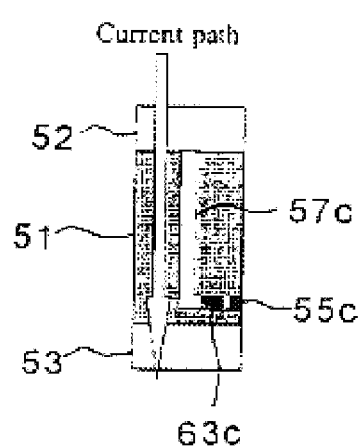
FIG. 20A is a bottom view of the current detection resistor device having a lead wire with a matching resistor inserted therein.
Figure 20B:
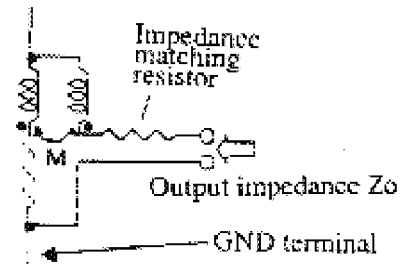
FIG. 20B is a diagram of an equivalent circuit thereof.

FIGS. 20A and 20B show another embodiment of the lead wire configuration, and in this case, matching resistor is provided for a lead wire. As shown in FIG. 20A, lead wire 57c conducting to the electrode 52 is provided with a matching resistor 63c in the vicinity of Kelvin terminal 55c. The lead wire 57c and Kelvin terminal 55c are electrically isolated from the resistor body 51. The matching resistor 63c may be served by, for example, a thick film resistor formed through screen-printing. Such a lead wire of non-balanced type is ideally suited to measuring impulse current, for example, using the current detection resistor device. In such a case, the measuring system to be provided on the circuit board 62 may adopt coaxial cable of 50 to 75 Ω, and in such a case, it is desirable to provide a matching resistor having impedance of in a 50 to 75 Ω range.

As described above, according to the present invention, a structure is provided for mounting a current detection resistor device that produces little measuring errors. Therefore, even if the current to be measured in an electronic device for example personal computers varies at high frequencies or flows at a high value of current as in notebook computers, for example, measuring errors can be compensated to enable stable operation and detection of current at high precision.

Although certain preferred embodiments of the present invention have been shown and described in detail, it should be understood that various changes and modifications may be made therein without departing from the scope of the appended claims.

What is claimed is:

1. A mounting structure for mounting a current detection resistor device comprising:
    a circuit board containing a pair of lands connecting to a respective electrode provided on each end of a resistor device;
    a circuit wiring for supplying a flow of current to be measured to a the resistor device connected between the pair of lands; and
    a voltage detection terminal wiring for detecting a voltage generated between ends of the resistor device,
    wherein the voltage detection terminal wiring is configured so as to extend from the lands along a current path of the resistor device first, and then, to bend at right angles to the current path, while maintaining electrical isolation from a resistor body of the resistor device; and
    wherein each of the pair of lands has a height and the voltage detection terminal wiring prior to the right angle bend is extended within a height range of each of the pair of lands and within a height range of the resistor device.

2. A mounting structure according to claim 1, wherein the voltage detection terminal wiring is configured so as to extend inwardly along a central axis of respective lands, and then, to bend at right angles in opposite directions to extend along a central axis between the lands.

3. A mounting structure according to claim 1, wherein the voltage detection terminal wiring is configured so as to extend inwardly along a central axis of respective lands, and then, to bend vertically in opposite directions to extend at right angles along a central axis between the lands, in such a way that one wiring loops around to a back side of the circuit board through a via-hole formed in the circuit board, so that the wiring and other wiring are aligned and extended parallel to each other on a front surface and a back surface of the circuit board.

4. A mounting structure according to claim 1, wherein the voltage detection terminal wiring is provided with an integrator comprised by a resistance (Ri) and a capacitance (Ci), such that the integrator is related to a effective inductance value (Le) and a resistance value of the resistor device (R) through a relation:

$$Ci \times Ri = Le/R.$$

5. A mounting structure for mounting a current detection resistor device on a circuit board, said resistor device having a pair of electrodes at both longitudinal ends of a resistor body, comprising:
    a pair of lands on the circuit board connected to said pair of electrodes of said resistor device, wherein the resistor body of the resistor device is disposed on said circuit board between said pair of lands while maintaining electrical isolation;
    a pair of circuit wirings on said circuit board for supplying a flow of current to be measured by said resistor device; and
    a pair of voltage detection terminal wirings on said circuit board for detecting a voltage generated between a number of ends of the resistor device, wherein the pair of voltage detection terminal wirings is configured to extend from the pair of lands beneath the resistor body along a longitudinal direction of the resistor body first so as to be magnetically coupled to said flow of current in said resistor device, and then, to bend at a right angle to the longitudinal direction of the resistor body on the circuit board.

6. A mounting structure according to claim 5, wherein an error voltage detected between the pair of voltage detection terminal windings, which is caused by a self-inductance of the resistor device, is cancelled by a voltage caused by a magnetically coupled mutual inductance generated in the pair of voltage detection terminal wirings.

7. A mounting structure according to claim 5, wherein the pair of voltage detection terminal wirings from the pair of lands is placed so as to be coincide with a central axis of the pair of lands.

8. A mounting structure according to claim 5, wherein the pair of voltage detection terminal wirings from the pair of lands is placed so as to be displaced from a central axis of the pair of lands.

9. A mounting structure according to claim 5, wherein the pair of voltage detection terminal wirings is extended toward a central axis of the pair of lands and is bent upon reaching the central axis between the pair of lands and the pair of voltage detection terminal wirings extend in opposite directions along the central axis between the pair of lands.

10. A mounting structure according to claim 5, wherein the pair of voltage detection terminal wirings is extended beyond a central axis of the pair of lands and is bent between the pair of lands then to extend along the central axis between the pair of lands.

11. A mounting structure according to claim 5, wherein the pair of voltage detection terminal wirings is extended toward a central axis of the pair of lands and is bent before reaching the central axis between the pair of lands then to extend along the central axis between the pair of lands.

12. A mounting structure according to claim 5, wherein a wiring loops around a back side of the circuit board through a via-hole formed in the circuit board, so that the wiring and other wiring are aligned and extended in parallel to each other on a front surface and a back surface of the circuit board, respectively.

13. A mounting structure according to claim 5, wherein the pair of voltage detection terminal wirings is provided with an integrator comprised of a resistance (Ri) and a capacitance (Ci), such that the integrator is related to an effective inductance value (Le) and a resistance value of the resistor device (R) through a relation:

$Ci \times Ri = Le/R.$

14. A mounting structure according to claim 5, wherein a saw-teeth waveform current is measured through the resistor device.

15. A mounting structure according to claim 5, wherein an effective inductance value is computed basing on a variation in the flow of current and a corresponding variation in the voltage.

16. A mounting structure according to claim 15, wherein a computation of the effective inductance value is carried out according to an expression:

$$Le = \frac{\Delta V \times T}{Vip\_p/R} \times D \times (1-D)$$

where D is a duty cycle, T is a period, R is a resistance value of the resistor device, Vip_p is a value of change in current, and $\Delta V$ is a value of voltage change at an apex of a current waveform.

17. A mounting structure according to claim 15, wherein an effective inductance value of the resistor device is obtained by subtracting a value of mutual-inductance produced by the pair of voltage detection terminal wirings connected to the resistor device from a value of self-inductance of the resistor device.

18. A mounting structure for mounting a current detection resistor device on a circuit board, said resistor device having a pair of electrodes at both longitudinal ends of a resistor body, comprising:

a pair of lands on the circuit board connected to said pair of electrodes of said resistor device, wherein the resistor body of the resistor device is disposed on said circuit board between said pair of lands while maintaining electrical isolation;

a pair of circuit wirings on said circuit board for supplying a flow of current to be measured by said resistor device; and a pair of voltage detection terminal wirings on said circuit board for detecting a voltage generated between a number of ends of the resistor device, wherein the pair of voltage detection terminal wirings is configured so as to extend inwardly along a central axis of respective pair of lands, and then, to bend vertically in opposite directions to extend at a right angle along the central axis between the pair of lands;

wherein a wiring loops around a back side of the circuit board through a via-hole formed in the circuit board, so that the wiring and other wiring are aligned and extended in parallel to each other on a front surface and a back surface of the circuit board, respectively.

19. A mounting structure according to claim 18, wherein an error voltage detected between the pair of voltage detection terminal windings, which is caused by generation of a self-inductance of the resistor device, is cancelled by a voltage caused by a magnetically coupled mutual inductance generated in the pair of voltage detection terminal wirings.

20. A mounting structure according to claim 18, wherein the pair of voltage detection terminal wirings is provided with an integrator comprised of a resistance (Ri) and a capacitance (Ci), such that the integrator is related to an effective inductance value (Le) and a resistance value of the resistor device (R) through a relation:

$Ci \times R = Le/R.$

21. A mounting structure according to claim 18, wherein a saw-teeth waveform current is measured through the resistor device.

22. A mounting structure according to claim 18, wherein an effective inductance value is computed based on a variation in the flow of current and a corresponding variation in the voltage.

23. A mounting structure according to claim 18, wherein a computation of an effective inductance value is carried out according to an expression:

$$Le = \frac{\Delta V \times T}{Vip\_p/R} \times D \times (1-D)$$

where D is a duty cycle, T is a period, R is a resistance value of the resistor device, Vip_p is a value of change in current, and $\Delta V$ is a value of voltage change at an apex of a current waveform.

24. A mounting structure according to claim 18, wherein an effective inductance value of the resistor device is obtained by subtracting a value of a mutual-inductance produced by the pair of voltage detection terminal wirings connected to the resistor device from a value of a self-inductance of the resistor device.

* * * * *

UNITED STATES PATENT AND TRADEMARK OFFICE
CERTIFICATE OF CORRECTION

PATENT NO.    : 6,798,189 B2
DATED         : September 28, 2004
INVENTOR(S)   : Koichi Hirasawa It is certified that error appears in the above-identified patent and that said Letters Patent is hereby corrected as shown below:

Column 13,
Line 66, please delete "a" before -- the resister --.

Column 14,
Line 27, please change "board." to -- board, respectively. --.

Signed and Sealed this

Sixteenth Day of August, 2005

JON W. DUDAS
*Director of the United States Patent and Trademark Office*